(12) United States Patent
Shirvani et al.

(10) Patent No.: US 10,538,427 B2
(45) Date of Patent: Jan. 21, 2020

(54) DRIVE MODE AND SENSE MODE RESONANCE FREQUENCY MATCHING

(71) Applicant: InvenSense, Inc., San Jose, CA (US)

(72) Inventors: Alireza Shirvani, Menlo Park, CA (US); Sagar Kumar, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 143 days.

(21) Appl. No.: 15/682,408

(22) Filed: Aug. 21, 2017

(65) Prior Publication Data

US 2019/0055116 A1 Feb. 21, 2019

(51) Int. Cl.

| | |
|---|---|
| G01C 19/5762 | (2012.01) |
| B81B 3/00 | (2006.01) |
| H03H 3/007 | (2006.01) |
| H03H 9/02 | (2006.01) |
| H01L 21/768 | (2006.01) |
| H01G 5/40 | (2006.01) |
| G01P 15/097 | (2006.01) |
| G01P 15/125 | (2006.01) |
| G01C 19/5656 | (2012.01) |

(52) U.S. Cl.
CPC ........ *B81B 3/0072* (2013.01); *G01C 19/5762* (2013.01); *G01P 15/0975* (2013.01); *G01P 15/125* (2013.01); *H01G 5/40* (2013.01); *H01L 21/76898* (2013.01); *H03H 3/0075* (2013.01); *H03H 9/02259* (2013.01); *G01C 19/5656* (2013.01)

(58) Field of Classification Search
CPC ..................... G01C 19/5719; G01C 19/5762
See application file for complete search history.

(56) References Cited

U.S. PATENT DOCUMENTS

| | | | |
|---|---|---|---|
| 5,780,740 A * | 7/1998 | Lee ...................... B06B 1/0292 | 331/156 |
| 2016/0202061 A1* | 7/2016 | Maurer .............. G01C 19/5762 | 73/504.12 |
| 2017/0191830 A1* | 7/2017 | Maeda .................. G01P 15/097 | |

OTHER PUBLICATIONS

Oh et al., "A Tunable Vibratory Microscope," Sensors and Actuators A 64 (1998), 51-56. (Year: 1998).*

* cited by examiner

*Primary Examiner* — John E Chapman, Jr.

(57) ABSTRACT

In some embodiments, a micro electro mechanical system (MEMS) includes a proof mass, sense electrodes, sense circuitry, and a frequency matching circuitry. The proof mass is configured to move responsive to stimuli. The sense electrodes are configured to generate a signal responsive to the proof mass moving. The sense circuitry is coupled to the sense electrodes. The sense circuitry is configured to receive the generated signal and further configured to process the generated signal. The frequency matching circuitry is configured to apply a DC voltage to the sense electrodes. The DC voltage is configured to change a stiffness of a spring of the proof mass. According to some embodiments, the change in the stiffness of the spring matches a resonance frequency between a sense mode and a drive mode. According to some embodiments, the sense electrodes are a comb structure.

16 Claims, 13 Drawing Sheets

DRIVE MODE AND SENSE MODE RESONANCE FREQUENCY MATCHING

BACKGROUND

Many electronic devices utilize sensors for various applications, e.g., detecting motion, detecting finger print, detecting acceleration, etc. Some sensors use a microelectromechanical system (MEMS). In certain MEMS Gyroscope technology, e.g., force feedback, performance may be improved by matching the resonance frequency between the drive mode and the sense mode. Conventionally, dedicated electrodes that are separate from the sense electrodes and drive electrodes have been used to match the resonance frequency between the drive mode and the sense mode. Unfortunately, the addition of a separate electrode is costly because it adversely impacts the area density as well as requiring supporting circuitry.

SUMMARY

Accordingly, a need has arisen to match the resonance frequency of the drive mode and the sense mode using substantially the existing electrodes, e.g., sensing electrodes. Moreover, a need has arisen to match the resonance frequency of the drive mode and the sense mode with minimal supportive circuitry and with minimal impact on the area density.

In some embodiments, a direct current (DC) voltage is applied through a high impedance circuitry to the sense electrodes in order to have minimal, if any, impact on the received signal. In other words, the sense electrodes are used both for sensing and for matching the resonance frequency of drive mode and sense mode. Furthermore, the high impedance circuitry used avoids using polyresistors because polyresistors utilize substantial silicon area.

In some embodiments, a micro electro mechanical system (MEMS) includes a proof mass, sense electrodes, sense circuitry, and a frequency matching circuitry. The proof mass is configured to move responsive to stimuli. The sense electrodes are configured to generate a signal responsive to the proof mass moving. The sense circuitry is coupled to the sense electrodes. The sense circuitry is configured to receive the generated signal and further configured to process the generated signal. The frequency matching circuitry is configured to apply a DC voltage to the sense electrodes. The DC voltage is configured to change a stiffness of a spring of the proof mass. According to some embodiments, the change in the stiffness of the spring matches a resonance frequency between a sense mode and a drive mode. According to some embodiments, the sense electrodes are a comb structure.

In some embodiments, the frequency matching circuitry includes a diode, a capacitor coupled to the diode, and an NMOS switch. The diode is configured to charge the capacitor when the NMOS switch is open. In some embodiments, the diode is configured to charge the capacitor when the NMOS switch is open and when the bottom plate of the capacitor potential is lowered. The NMOS switch is configured to electrically connect the capacitor to the sense electrodes and to the sense circuitry when the NMOS switch is closed. The DC voltage is a voltage from the capacitor being applied to the sense electrodes when the NMOS switch closes. The diode is electrically disconnected from the capacitor when the NMOS switch is closed. In some embodiments, the diode is electrically disconnected from the capacitor when the NMOS switch is closed and the bottom plate of the capacitor potential is raised. The NMOS switch is protected against high voltage stress applying appropriate potential to open the NMOS switch when the capacitor is being charged by the diode and by applying appropriate potential to close the NMOS switch when the capacitor is not being charged by the diode.

It is appreciated that in some embodiments, a circuitry for generating a signal for closing and opening the NMOS switch includes another diode, a level shifter, and another capacitor. The level shifter may be configured to receive a signal having a first voltage value or a second voltage value. The level shifter is further configured to generate a shifted signal having the first voltage value or a third voltage value. The another capacitor is coupled between the diode and the level shifter. A voltage associated with the another capacitor is the DC voltage being applied to the sense electrodes. The another capacitor is charged using the another diode and output of the level shifter. The voltage is a sum of the first voltage value and a voltage being applied by the another diode or a sum of the third voltage value and the voltage being applied by the another diode.

It is appreciated that in some embodiments, the frequency matching circuitry is coupled to a capacitor that is coupled to the sense circuitry. The capacitor masks the sense circuitry from the DC voltage being applied.

According to some embodiments, the frequency matching circuitry may include a PMOS switch, a capacitor coupled to the PMOS switch, and a NMOS switch. It is appreciated that in some embodiments, the PMOS switch is configured to charge the capacitor in response to the bottom plate of the capacitor potential being lowered and when the NMOS switch is open. It is appreciated that the capacitor is electrically connected to the sense electrodes when the NMOS switch is closed and when the PMOS switch is open and that the DC voltage is applied to the sense electrodes when the capacitor is electrically connected to the sense electrodes. The NMOS switch is protected against high voltage stress by applying appropriate potential to open the NMOS switch when the capacitor is being charged by the diode and by applying appropriate potential to close the NMOS switch when the capacitor is not being charged by the diode.

It is appreciated that in some embodiments the MEMS may further include a force feedback circuitry configured to apply a charge associated with a sensed signal to the sense electrodes during a forcing time period to move the proof mass from a first position to a second position. It is appreciated that the sense circuitry is inactive during the forcing time period. The forced feedback circuitry and the sense circuitry are time multiplexed. The sense electrodes are used for sensing, for forced feedback and for matching the resonance frequency between the sense mode and the drive mode.

These and other features and aspects of the concepts described herein may be better understood with reference to the following drawings, description, and appended claims.

DETAILED DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," "interior," "exterior," "external", "internal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

A need has arisen to match the resonance frequency of the drive mode and the sense mode using substantially the existing electrodes, e.g., sensing electrodes. Moreover, a need has arisen to match the resonance frequency of the drive mode and the sense mode with minimal supportive circuitry and with minimal impact on the silicon area.

In some embodiments, a direct current (DC) voltage is applied through a high impedance circuitry to the sense electrodes in order to have minimal, if any, impact on the received signal. In other words, the sense electrodes are used both for sensing and for matching the resonance frequency during drive mode and sense mode. Furthermore, use of the high impedance circuitry avoids using polyresistors because polyresistors utilize substantial areal density.

Figure 1A:
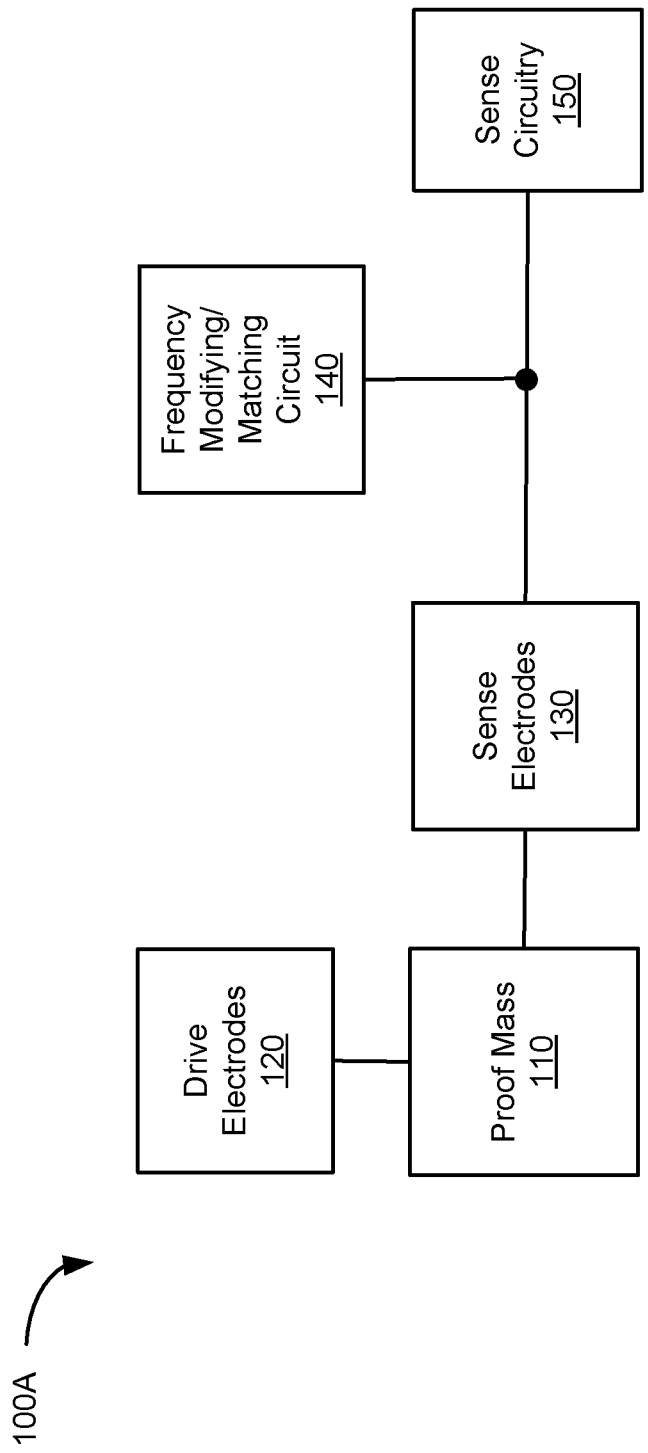
FIGS. 1A-1H show a sensor with frequency matching circuitry in accordance with some embodiments.

Referring now to FIGS. 1A-1H, a sensor with frequency matching circuitry in accordance with some embodiments is shown. Referring specifically to FIG. 1A, a sensor 100A is shown. Sensor 100A may include a proof mass 110, drive electrodes 120, sense electrodes 130, sense circuitry 150, and a frequency matching/modifying circuit 140.

MEMS 100A is driven into oscillation at the resonance frequency of the drive mode, e.g., using the drive electrodes 120. In some embodiments, the drive mode may be a mechanical resonance mode in which the proof mass is driven at a resonance frequency of the mechanical structure. MEMS 100A may also include sense electrodes 130 that are used to generate a signal in response to the proof mass 110 moving when stimuli is applied, e.g., rotation force, acceleration, displacement, etc. The sense circuitry 150 may process the generated signal from the sense electrodes 130 and generate sensed signals.

As described above, it is desirable in certain gyroscopes for the resonance frequency of the drive mode to match the resonance frequency of the sense mode. As such, the frequency matching/modifying circuit 140 may be used. The frequency matching/modifying circuitry 140 is configured to apply a DC voltage to the sense electrodes 130. Applying the DC voltage to the sense electrodes 130 changes the stiffness of a spring associated with the proof mass 110, thereby changing the resonance frequency of the vibrating structure. As such, the resonance frequency in drive mode may be matched with that of sense mode, thereby improving the performance. Moreover, applying the DC voltage to the sense electrodes 130 eliminates the need of dedicated electrodes in order to match the resonance frequency of the drive mode to that of the sense mode.

Figure 1B:
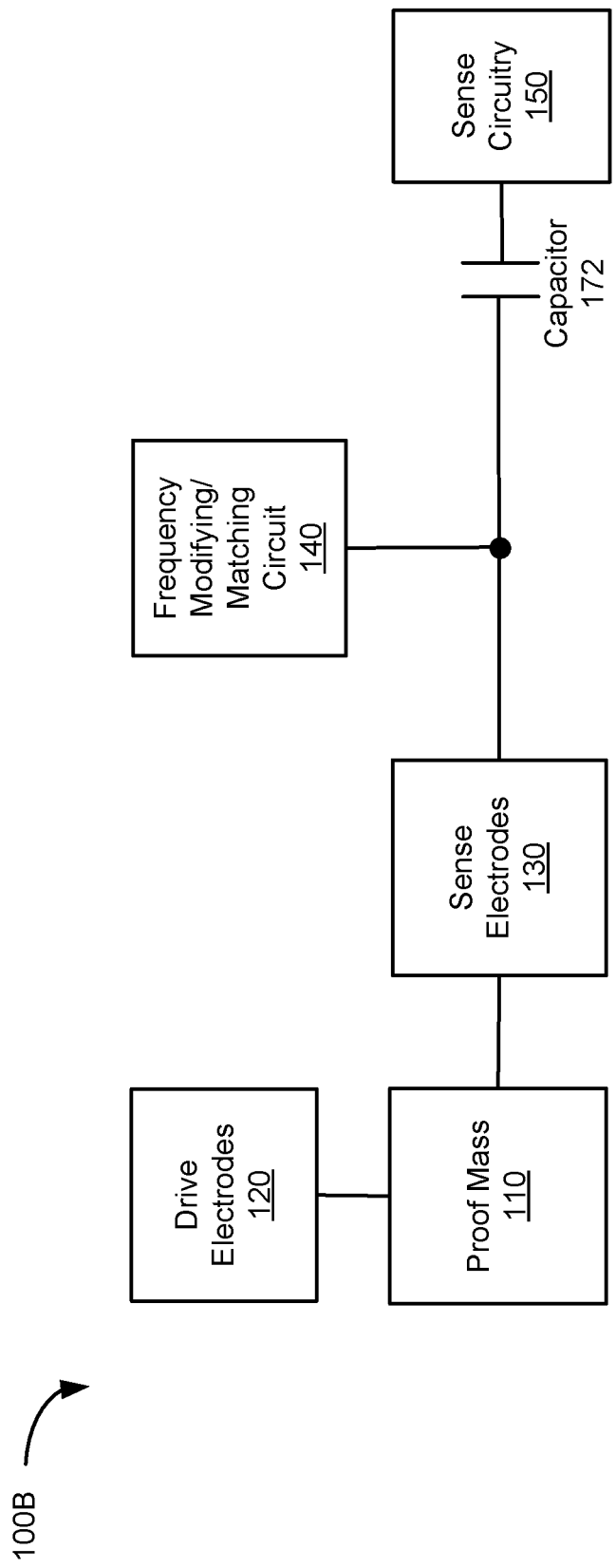

Referring now to FIG. 1B, MEMS 100B is shown in accordance with one embodiment. The sense electrodes 130 and the frequency modifying/matching circuit 140 may be coupled to the sense circuitry 150 via capacitor 172. Capacitor 172 is used to mask the sense circuitry 150 from the DC voltage being applied by the frequency modifying/matching circuit 140 to the sense electrodes 130. In other words, the DC voltage is applied by the frequency modifying/matching circuit 140 to the sense electrodes 130 while the capacitor 172 block the DC voltage from being applied to the sense circuitry 150.

Figure 1C:
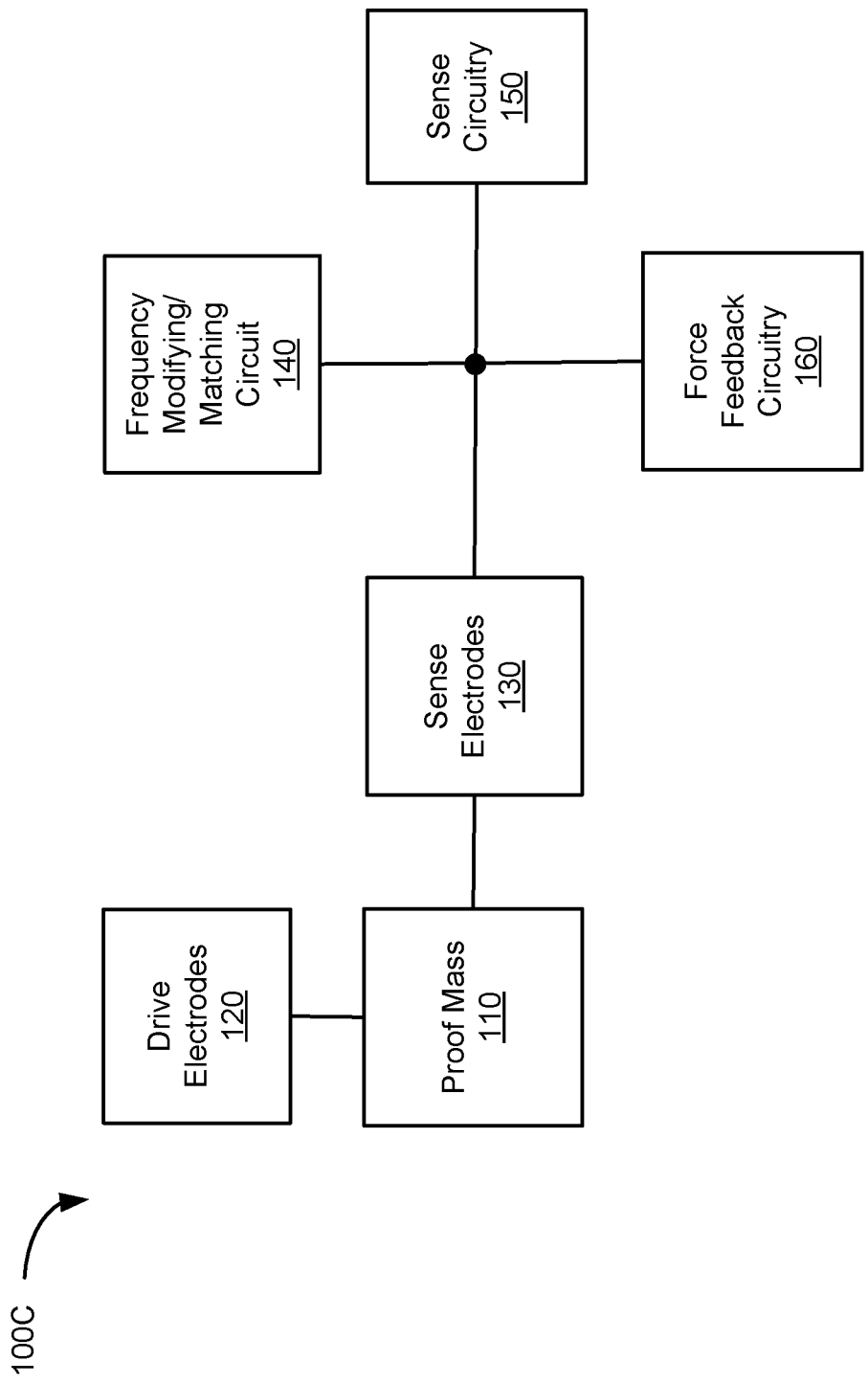

Referring now to FIG. 1C, MEMS 100C is shown in accordance with some embodiments. MEMS 100C includes a force feedback circuitry 160. The force feedback circuitry 160 is configured to apply a charge associated with the sensed signal to the sense electrodes 130 during a forcing time period to move the proof mass 110 from a first position to a second position. It is appreciated that in some embodiments, the charges are applied through the force feedback circuitry 160 when the sense circuitry 150 is inactive during the forcing time period. It is appreciated that in some embodiments, the forced feedback circuitry 160 and the sense circuitry 150 are time multiplexed. It is also appreciated that the DC voltage may be applied by the frequency modifying/matching circuit 140 during the sensing phase/mode. Accordingly, the sense electrodes 130 are used for sensing, for forced feedback, and for matching the resonance frequency between the sense mode and the drive mode, without a need for any additional electrodes but rather with using the same sensing electrodes 130. It is appreciated that the force feedback circuity 160 is described in the U.S. patent application Ser. No. 15/265,740 that was filed on Sep. 14, 2016, assigned to the same assignee, which is incorporated herein by reference in its entirety.

Figure 1D:
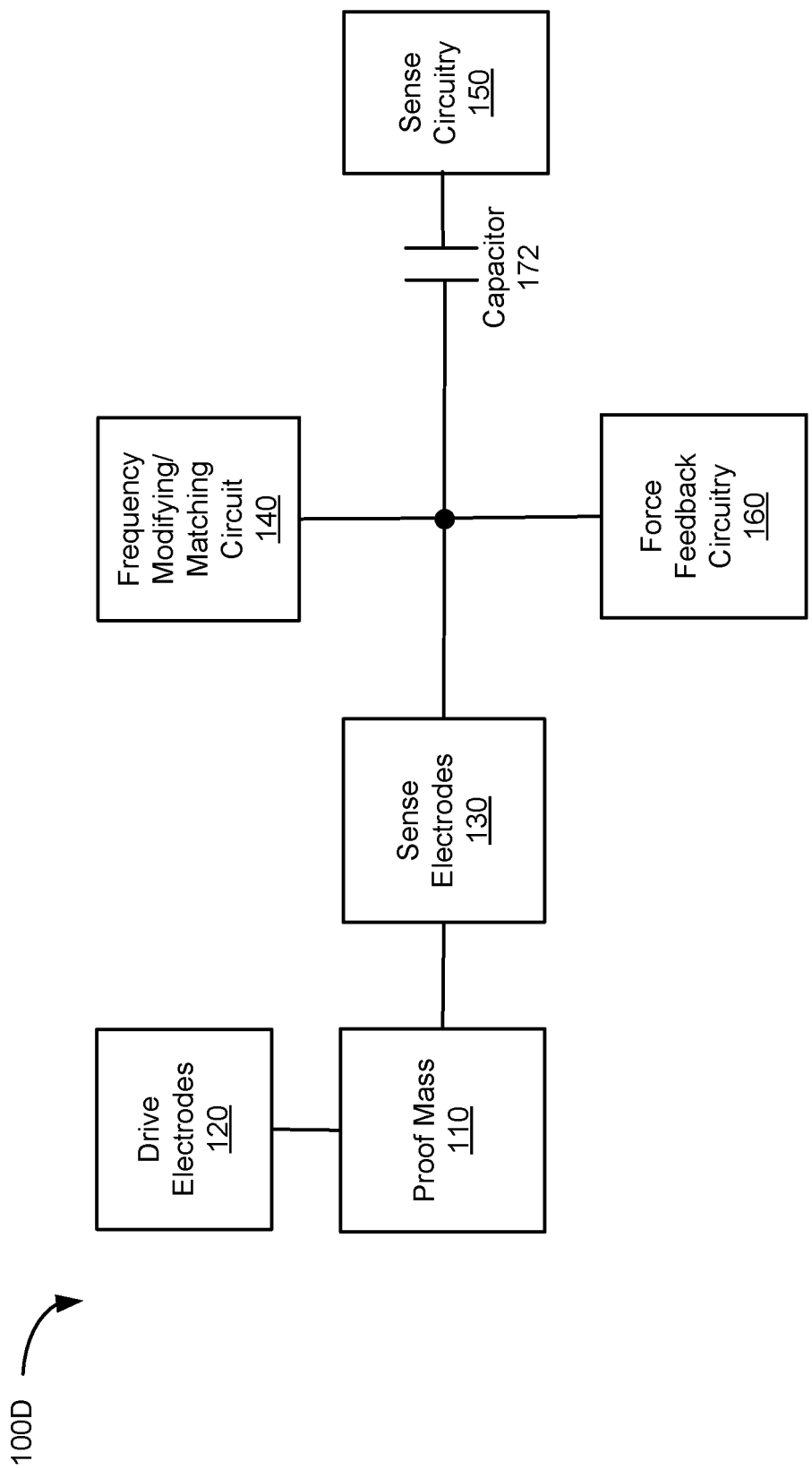

Referring now to FIG. 1D, a MEMS 100D structure that is a combination of MEMS 100B and 100C is shown. In other words, MEMS 100D includes the capacitor 172 to block the DC voltage from being applied to the sense circuitry 150 and the force feedback circuitry 160 for applying a charge associated with the sensed signal to the sense electrodes 130 during a forcing time period to move the proof mass 110 from a first position to a second position.

Figure 1E:
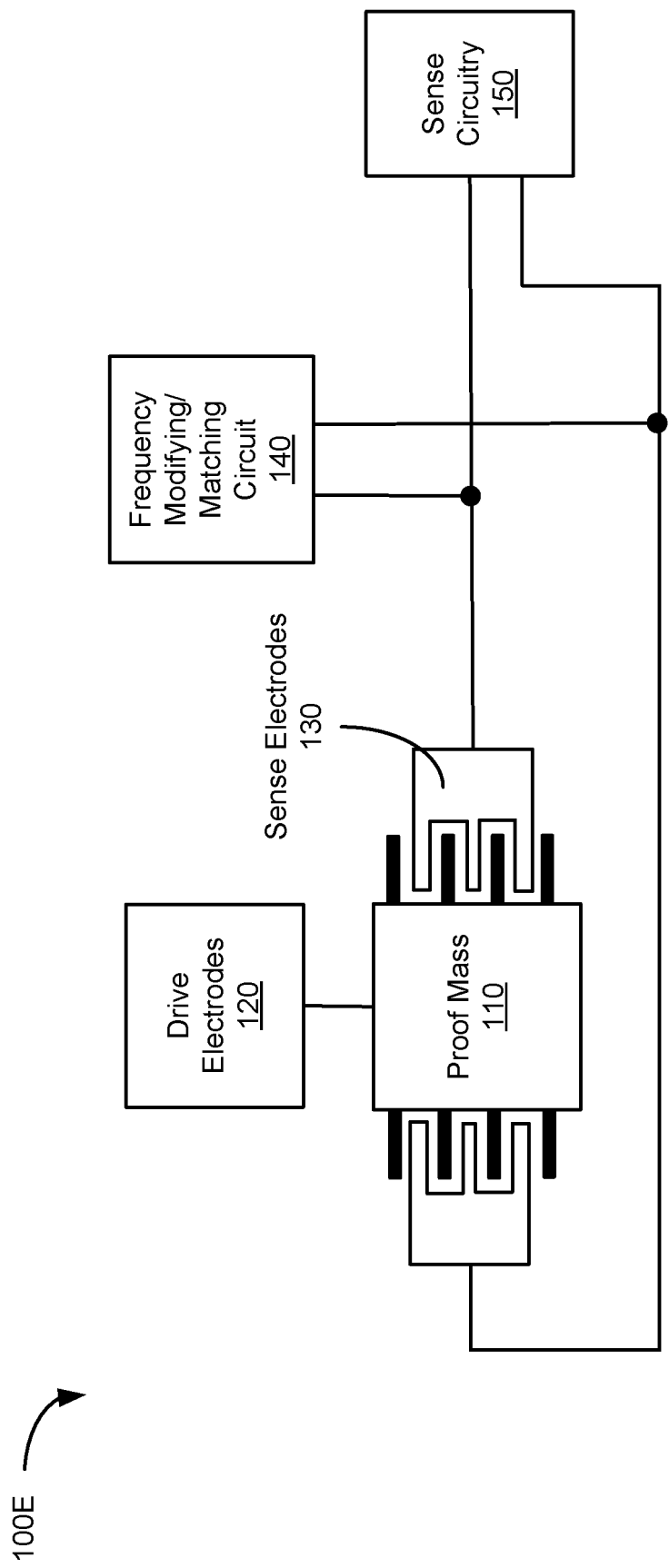

Referring now to FIG. 1E, MEMS 100E is shown where the sense electrodes 130 are combed structure sense electrodes. The operation of MEMS 100E is similar to that described in FIG. 1A.

Figure 1F:
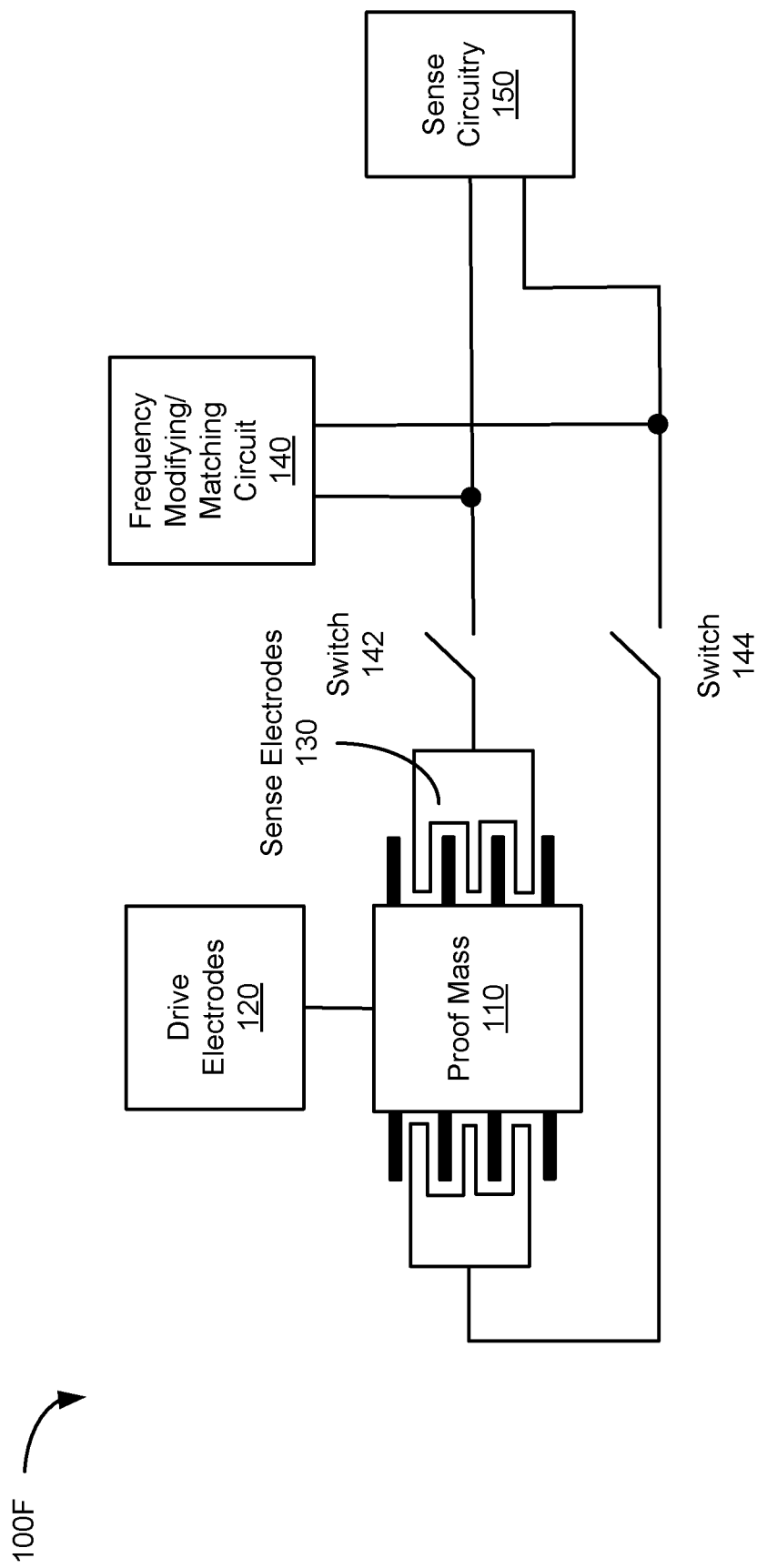

Referring now to FIG. 1F, MEMS 100F is shown that is similar to FIG. 1E. In this embodiment, application of the DC voltage by the frequency modifying matching circuit 140 to the sense electrodes 130 may be controlled through the use of switches 142 and 144, e.g., NMOS, PMOS, etc. It is appreciated that in some embodiments, the switches 142 and 144 may be integrated within the frequency modifying/matching circuit 140. It is also appreciated that the switches 142 and 144 may be controlled to apply the DC voltage during a sensing mode as opposed to a drive mode, for example.

Figure 1G:
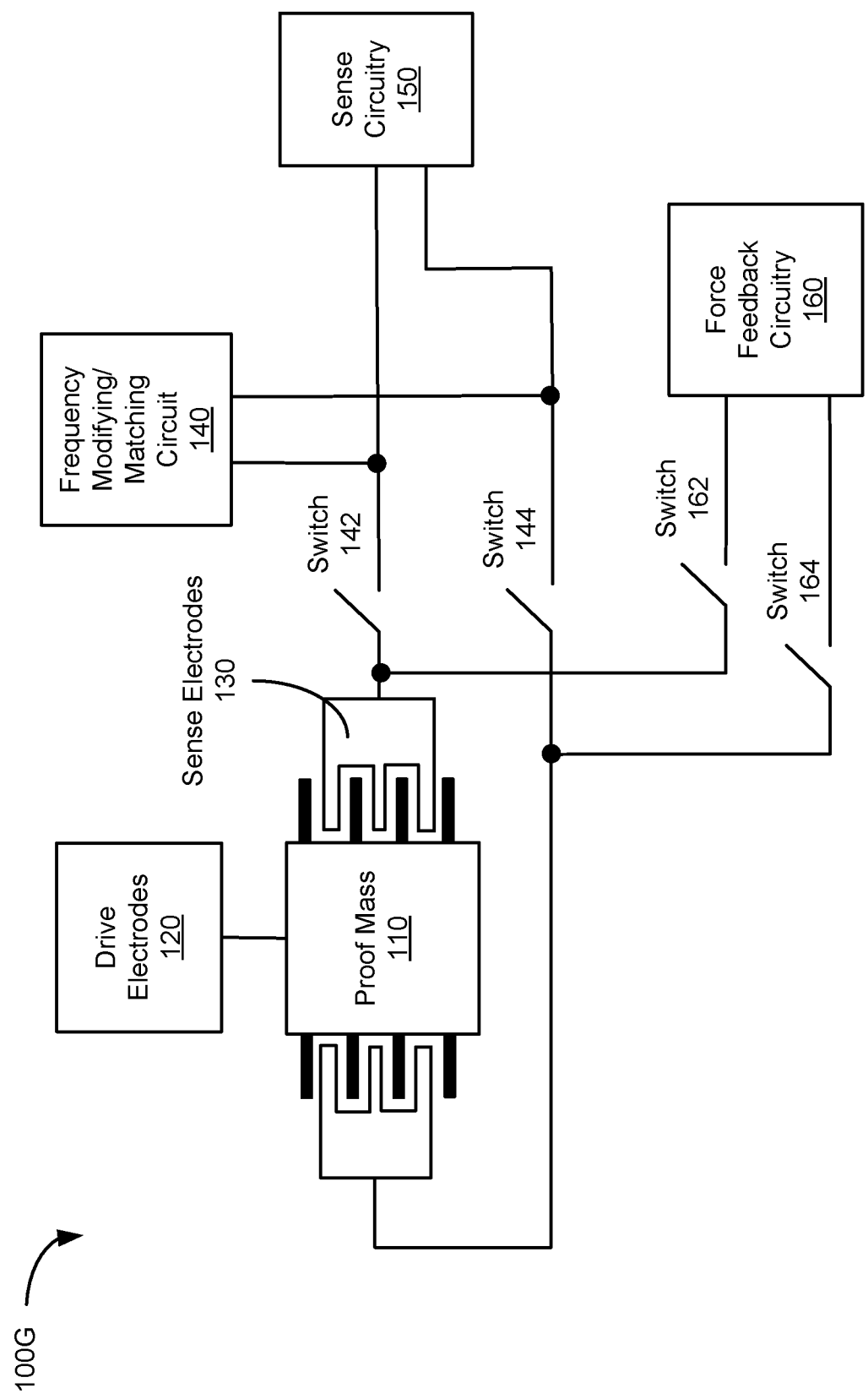

Referring now to FIG. 1G, MEMS 100G is shown. MEMS 100G functions similar to that of FIG. 1F. In this embodiment, however, the force feedback circuitry 160 is also used to apply a charge associated with the sensed signal to the sense electrodes 130 during a forcing time period to move the proof mass 110 from a first position to a second position. Application of the charges through the force feedback circuitry 160 may be controlled through switches 162 and 164. In other words, the switches 162 and 164, e.g., NMOS, PMOS, etc., are used to time multiplexed when the charges are applied from the force feedback circuitry 160 to the sense electrodes 130. In some embodiments, the switches 162 and 164 are closed when the MEMS 100G is not in the sense mode. As such, the charges from the force feedback circuitry 160 are applied to the sense electrodes 130 to move the proof mass 110 from a first position to a second position.

Figure 1H:
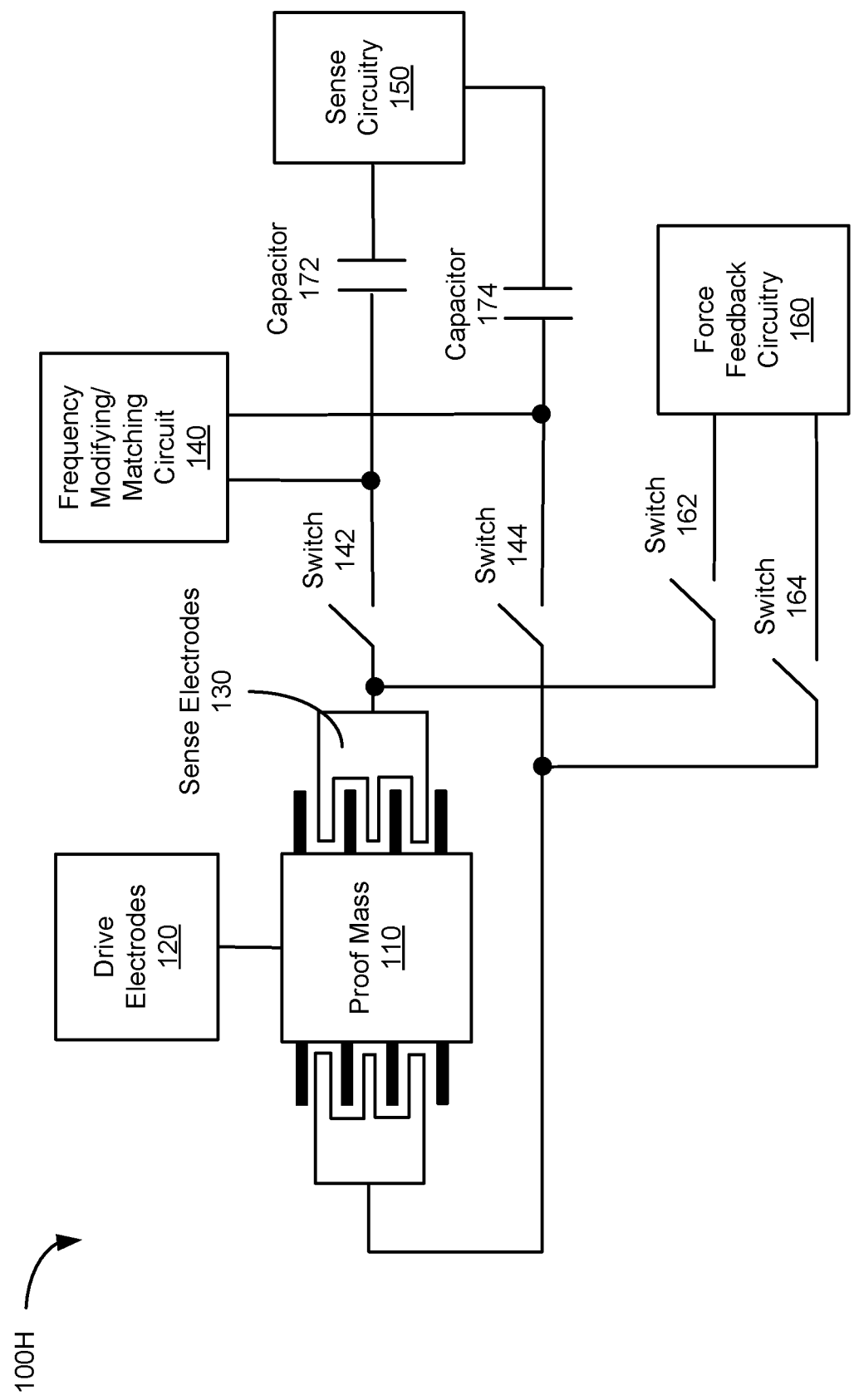

Referring now to FIG. 1H, MEMS 100H is shown. MEMS 100H is substantially similar to that of FIG. 1G. However, in this embodiments, capacitors 172 and 174 are used to block the DC voltage from being applied to the sense circuitry 150 while the DC voltage is being applied by the frequency modifying/matching circuit 140 to the sense electrodes 130.

Figure 2A:
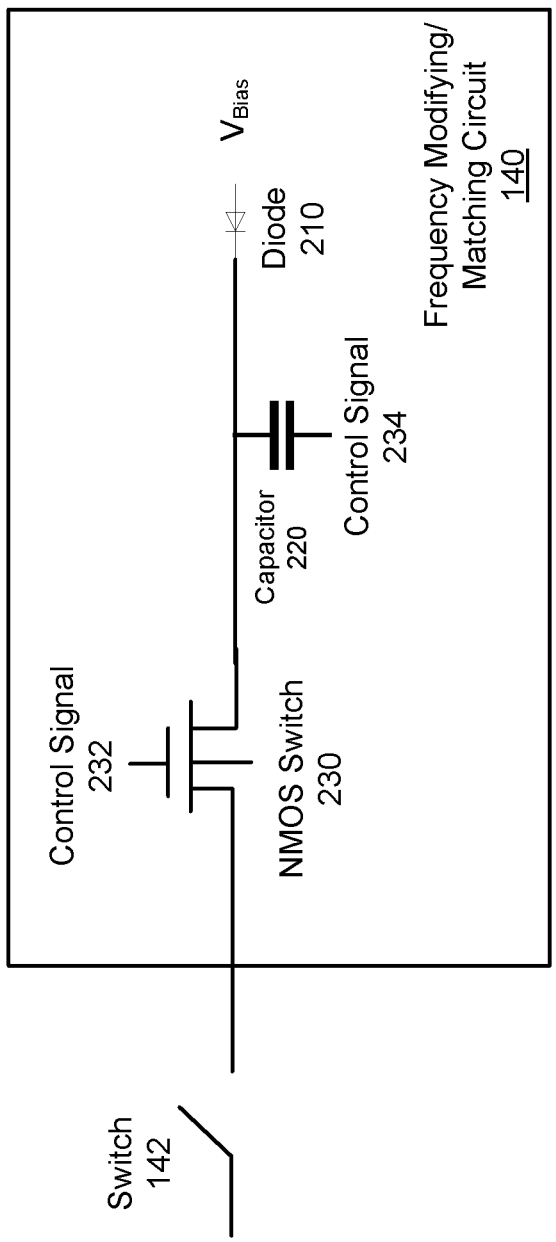
FIGS. 2A-2B show implementation embodiments of the frequency matching circuitry in accordance with some embodiments.
Figure 2B:
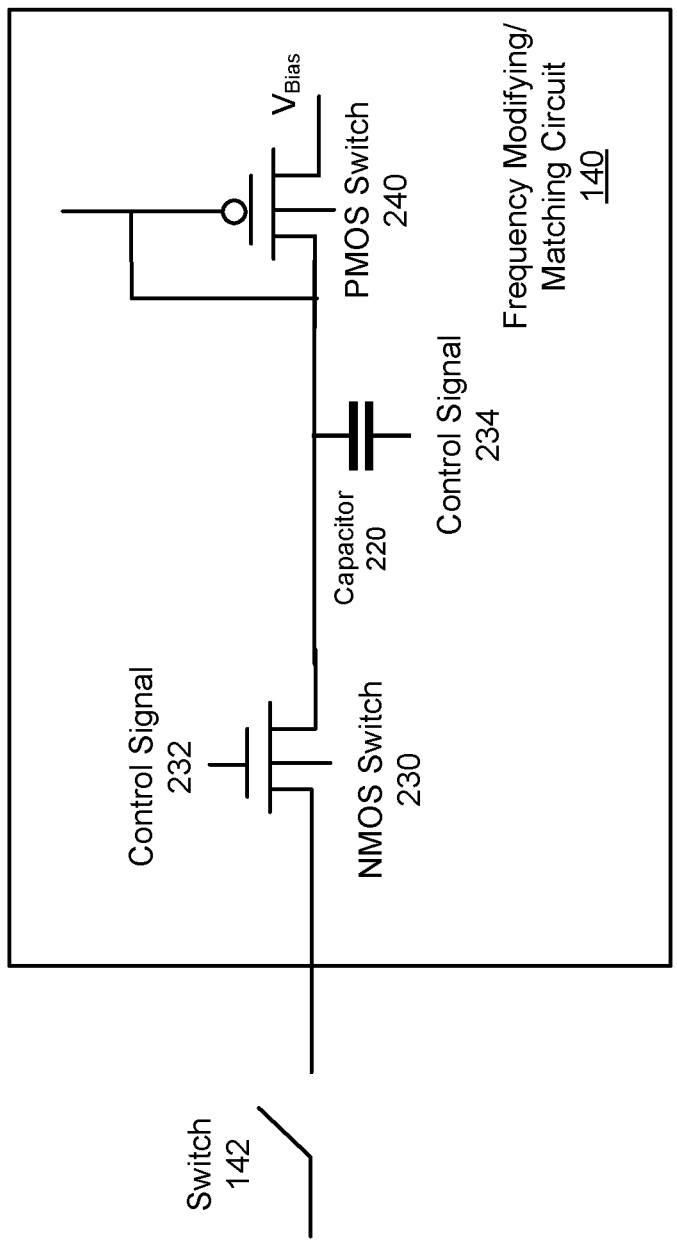

Referring now to FIGS. 2A-2B, implementation embodiments of the frequency matching circuitry in accordance with some embodiments is shown. Referring now specifically to FIG. 2A, one frequency modifying/matching circuit 140 implementation in accordance with some embodiments is shown. The frequency modifying/matching circuit 140 may include a NMOS switch 230, a capacitor 220 and a diode 210 coupled to a voltage source. It is appreciated that the capacitor 220 is used such that high DC voltage is applied through a high impedance circuitry to the sense electrodes 130 in order to have minimal, if any, impact on the received signal. It is also appreciated that the use of frequency matching circuitry 140 eliminates the need to use polyresistors which utilize substantial silicon area, thereby decreasing the footprint of the circuitry used. It is appreciated that the circuit configuration for the frequency modifying/matching circuit 140 may be used for each switch, e.g., switch 142, switch 144, etc. However, it is appreciated that the embodiment is described with respect to switch 142 but is equally applicable to switch 144.

It is appreciated that in some embodiments, switch 142 may also be NMOS switch and controlled using the same control signal as the NMOS switch 230. For example, the NMOS switch 230 and the NMOS switch 142 may each be controlled by the control signal 232, where a low asserted signal $V_{bias}$ voltage opens the respective switch and a high asserted signal $V_{bias}+V_{DDHV}$ voltage closes the respective switch. However, it is appreciated that in other embodiments, the switch 142 may not necessarily be NMOS switches and they may be controlled independent of the NMOS switch 230.

The diode 210 is biased to a $V_{bias}$ voltage. The NMOS switch 230 and switch 142 and are open when the control signal 232 is asserted low to $V_{bias}$ voltage. It is appreciated that in some embodiments, the control signal 234 may be asserted low to a 0 V when the NMOS switches 230 and 142 are open. As such, the voltage at the bottom plate of the capacitor 220 may be lowered to a 0 V, thereby lowering the voltage of the top plate of the capacitor 220, As such, the diode 210 charges the capacitor 220 up to the $V_{bias}$ voltage when the NMOS switch 230 is open. Once the capacitor 220 is charged up to $V_{bias}$ voltage, the control signal 232 is asserted high to $V_{bias}+V_{DDHV}$ voltage closing the NMOS switch 230. In some embodiments, the control signal 234 is asserted high to $V_{DDLV}$ when the NMOS switch 230 closes, thereby raising the voltage of the bottom plate of the capacitor 220 to $V_{DDLV}$, which raises the voltage of the top plate of the capacitor 220 by the same amount $V_{DDLV}$ to $V_{bias}+V_{DDLV}$. As such, the diode 210 is turned off. Similarly, switch 142 closes when the NMOS switch 230 closes. Accordingly, the charges stored on the capacitor 220 is transferred, which is subsequently applied as the DC voltage to the sense electrodes 130. In other words, the capacitor 220 is electrically connected to the sense electrodes 130 and to the sense circuitry 150 when the NMOS switch 230 and switch 142 close. Moreover, the capacitor 220 is electrically disconnected from the diode 210 when the NMOS switch 230 and switch 142 close and the voltage for the bottom plate of the capacitor 220 is raised.

It is appreciated that applying the DC voltage, e.g., $V_{bias}$ voltage in this instance, in this manner, protects the NMOS switch 230 from high voltage stress because the voltage seen by the NMOS switch 230 is the difference between $V_{bias}$ voltage and $V_{bias}+V_{DDLV}$ voltage or $V_{bias}+V_{DDHV}$ voltage which may be no more breakdown voltage of the transistor, e.g., 3 V. However, the $V_{bias}$ voltage being applied to as the DC voltage ($V_{bias}$) through the capacitor 220 may be as large as 3-4 times the breakdown voltage, e.g., 10 V. As such, application of the DC voltage to the sense electrodes 130 may be used to match/modify the resonance frequency of the drive mode and the sense mode while protecting the NMOS switch 230 from high voltage stress. It is appreciated that the embodiment described above similarly protects switch 142, e.g., NMOS switches, from voltage stress.

Referring now to FIG. 2B, another implementation of frequency matching circuitry in accordance with some embodiments is shown. FIG. 2B is substantially similar to that of FIG. 2A, described above. In this embodiment, the diode 210 is replaced with a PMOS switch 240. In this embodiment, when the PMOS switch 240 closes and when the NMOS switch 230 is open, the capacitor 220 charges to $V_{bias}$. Once the capacitor 220 is charged up and the control signal 234 is raised high, the PMOS switch 240 opens and the NMOS switch 230 closes. It is appreciated that the transfer of charges from the capacitor 220 and its application as a DC voltage to the sense electrodes 130 is similar to that described in FIG. 2A.

Figure 3A:
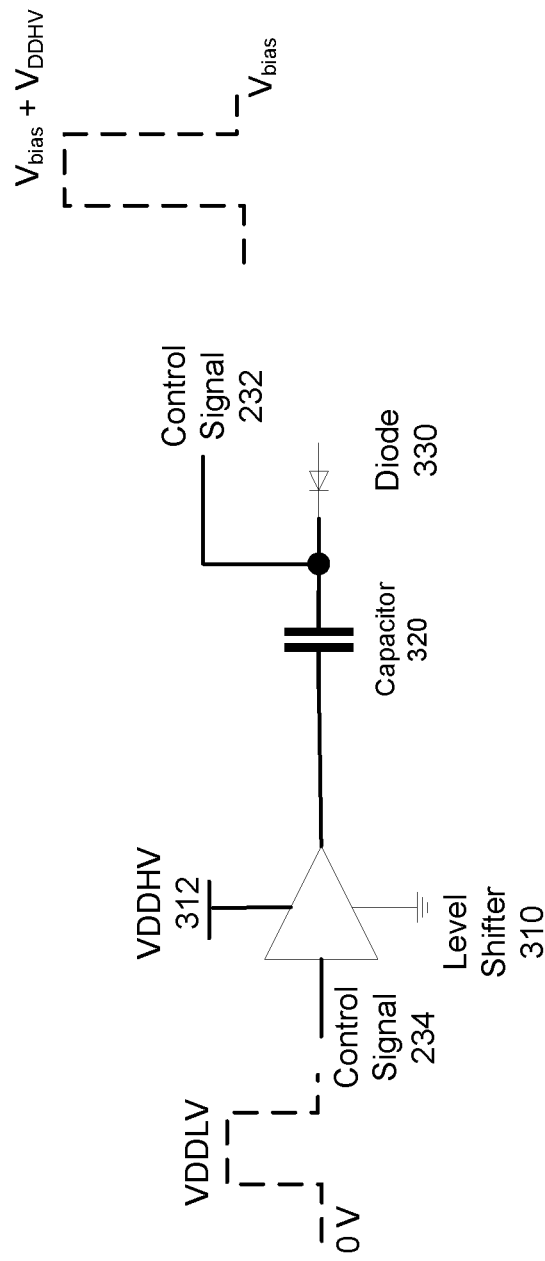
FIGS. 3A-3B show control signal generation in accordance with some embodiments.
Figure 3B:
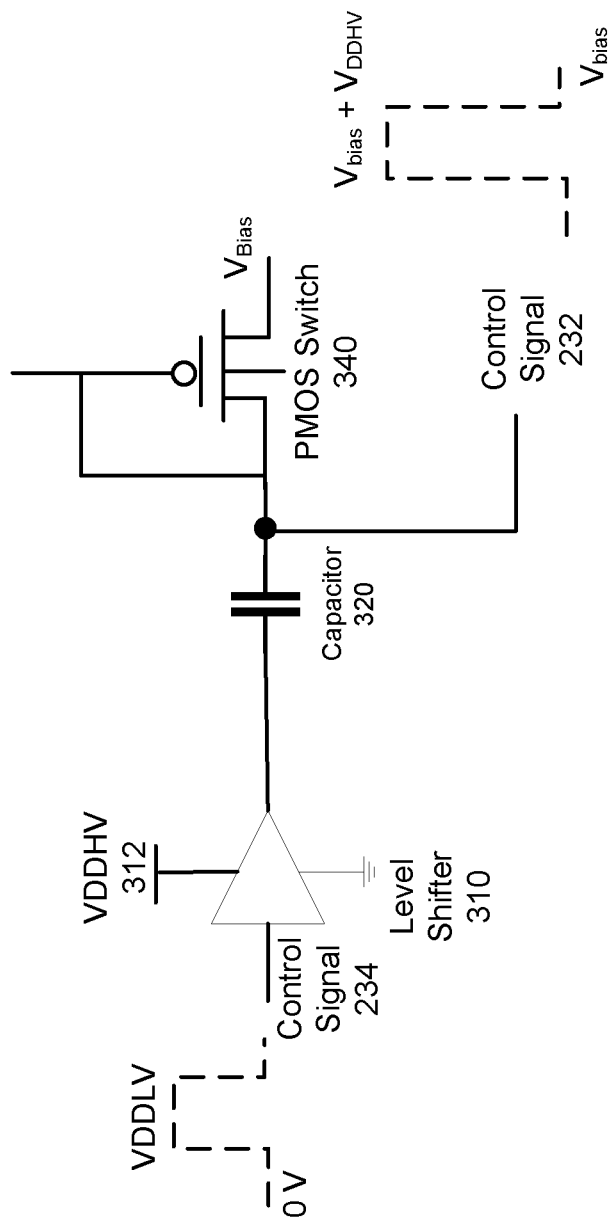

Referring now to FIGS. 3A-3B, control signal generation in accordance with some embodiments is shown. In some embodiments, the control signal 232 is generated such that the difference between the control signal 232 and the voltage on the capacitor 220 is small, e.g., 3 V, in order to protect the NMOS switch 230 and other switches, e.g., switch 142 or 144 (NMOS), from high voltage stress. Referring more specifically to FIG. 3A, a level shifter 310, a capacitor 320, and a diode 330 is used. In some embodiments, the level shifter 310 receives a low signal 0 V and a high signal $V_{DDLV}$ signal. When the level shifter 310 receives a 0 V, it outputs a 0 V and it outputs a $V_{DDHV}$ volt signal when the asserted high signal $V_{DDLV}$ is received. The diode 330 is coupled to a voltage source receiving $V_{Bias}$ signal. As such, the capacitor 320 charges up to $V_{Bias}$ voltage when the level shifter 310 receives a 0 V. Thus, the control signal 232 is $V_{Bias}$ signal when the level shifter 310 receives a 0 V signal. It is appreciated that when the level shifter 310 receives an asserted high signal $V_{DDLV}$, it outputs a $V_{DDHV}$ signal and the diode 330 is electrically disconnected from the capacitor 320. However, the capacitor 320 has been charged up to $V_{Bias}$ voltage. Thus, the change in $V_{DDHV}$ in the bottom plate of the capacitor 320 changes the capacitor 320 top plate voltage from $V_{Bias}$ to $V_{DDHV}+V_{Bias}$. As such, the control signal 232 swings between $V_{Bias}$ to $V_{DDHV}+V_{Bias}$. Thus, the NMOS switch 230 closes when the control signal 232 is $V_{DDHV}+V_{Bias}$ causing the charges on the capacitor 220 to be transferred and applied as a DC voltage to the sense electrodes 130 while protecting the NMOS switch 230 from high voltage stress. In other words, the input signal to the level shifter 310 is bootstrapped to the DC voltage being applied to the sense electrodes 130.

Referring now to FIG. 3B, another implementation for generating the control signal 232 in accordance with some embodiments is shown. FIG. 3B is substantially similar to that of FIG. 3A, described above. In this embodiment, the diode 330 is replaced with a PMOS switch 340. In this embodiment, when the level shifter 310 receives a 0 V, it outputs a 0 V, lowering the voltage of the bottom plate and top plate of the capacitor 320. As such, the PMOS switch 340 closes, charging the capacitor 320. Once the capacitor 320 is charged up and the level shifter receives $V_{DDLV}$, the PMOS switch 340 opens. It is appreciated that the operation of the capacitor 320 and the level shifter 310 is similar to that described in FIG. 3A.

Figure 4:
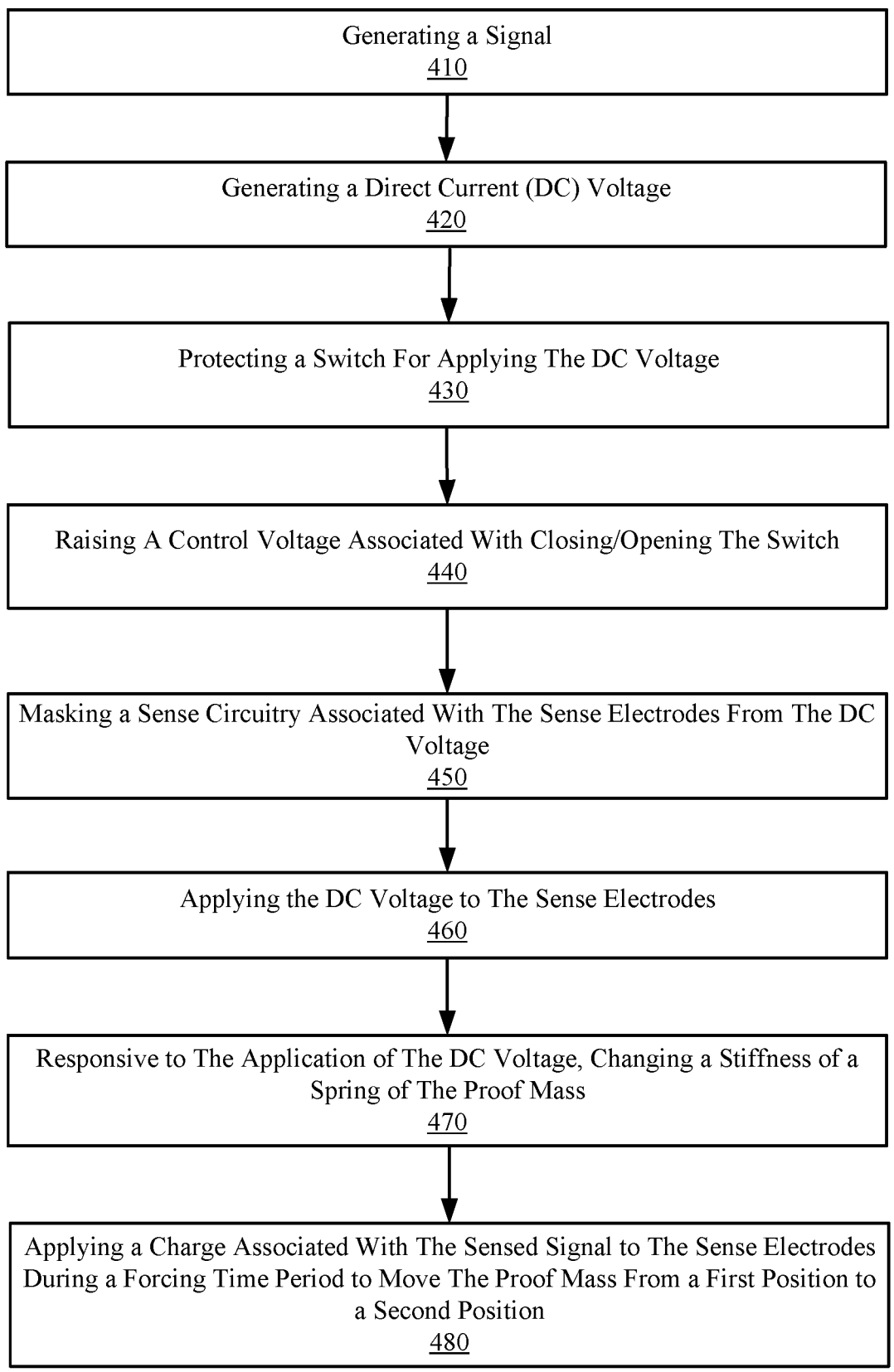
FIG. 4 shows an exemplary flow diagram for matching resonance frequency of drive mode and sense mode in accordance with some embodiments.

FIG. 4 shows an exemplary flow diagram 400 for matching resonance frequency of drive mode and sense mode in accordance with some embodiments. At step 410, a signal is generated, e.g., using the sense electrodes 130, responsive to a stimuli. At step 420, a DC voltage is generated in order to modify or match the resonance frequency in the drive mode and the sense mode (e.g., as described in FIGS. 1A-1H, 2A-2B and 3A-3B). At step 430, the switch, e.g., NMOS switch, used to control when the DC voltage is applied may be protected from high voltage stress (e.g., as described in FIGS. 2A-2B and 3A-3B). At step 440, the control voltage, e.g., control voltage 232, is raised from a low signal of 0 V to $V_{Bias}$ and from a high signal of $V_{DDLV}$ to $V_{DDHV}$ (e.g., as described in FIGS. 3A-3B) such that the voltage difference seen by the NMOS switch is small while the DC voltage being applied to the sense electrodes 130 is substantially higher than the voltage difference.

It is appreciated that the sense circuitry 150 may be masked from the DC voltage being applied at step 450 (e.g., as described in FIGS. 1B, 1D, and 1H) by using a capacitor. At step 460, the DC voltage may be applied to the sense electrodes 130. As such, the stiffness of a spring for the proof mass is changed, at step 470, thereby modifying/matching the resonance frequency of the drive mode to sense mode. It is appreciated that in some embodiments, at step 480, a charge associated with the sensed signal may be applied to the sense electrodes 130 during a forcing period to move the proof mass from a first position to a second position. The forced feedback circuitry and the sense circuitry are time multiplexed. The sense electrodes 130 are used for sensing, for forced feedback and for matching the resonance frequency between the sense mode and the drive mode.

Accordingly, no additional electrodes are used or needed, thereby reducing the silicon area. In other words, the resonance frequency of the drive mode and the sense mode are matched using substantially the existing electrodes, e.g., sensing electrodes, while using the same sense electrodes during forcing period. It is also appreciated that the resonance frequency of the drive mode and the sense mode are matched with minimal supportive circuitry and with minimal impact on the areal density. Moreover, it is appreciated that DC voltage is applied through a high impedance circuitry to the sense electrodes in order to have minimal, if any, impact on the received signal while avoiding using polyresistors because polyresistors utilize substantial areal density.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A micro electro mechanical system (MEMS) comprising:
    a proof mass configured to move responsive to stimuli;
    sense electrodes configured to generate a signal responsive to the proof mass moving;
    sense circuitry coupled to the sense electrodes, wherein the sense circuitry is configured to receive the generated signal and further configured to process the generated signal; and
    a frequency matching circuitry configured to apply a direct current (DC) voltage to the sense electrodes, wherein the DC voltage is configured to change a stiffness of a spring of the proof mass and wherein the change in the stiffness of the spring matches a resonance frequency between a sense mode and a drive mode, wherein the frequency matching circuitry comprises:
    a diode;
    a capacitor coupled to the diode; and
    an NMOS switch,
        wherein the diode is configured to charge the capacitor when the NMOS switch is open, and wherein the NMOS switch is configured to electrically connect the capacitor to the sense electrodes and to the sense circuitry when the NMOS switch is closed, wherein the DC voltage is a voltage from the capacitor being applied to the sense electrodes when the NMOS switch closes, and wherein the diode is electrically disconnected from the capacitor when the NMOS switch is closed, and wherein the NMOS switch is protected against high voltage stress by opening the NMOS switch when the capacitor is being charged by the diode and by closing the NMOS switch when the capacitor is not being charged by the diode.

2. The MEMS as described in claim 1, wherein the sense electrodes are a comb structure.

3. The MEMS as described in claim 1, wherein a circuitry for generating a signal for closing and opening the NMOS switch comprises:
   another diode;
   a level shifter configured to receive a signal having a first voltage value or a second voltage value and wherein the level shifter is configured to generate a shifted signal having the first voltage value or a third voltage value; and
   another capacitor coupled between the diode and the level shifter, wherein a voltage associated with the another capacitor is the DC voltage being applied to the sense electrodes, and wherein the another capacitor is charged using the another diode and output of the level shifter, and wherein the DC voltage is a sum of the first voltage value and a voltage being applied by the diode or a sum of the third voltage value and the voltage being applied by the another diode.

4. The MEMS as described in claim 1, wherein the frequency matching circuitry is coupled to a capacitor that is coupled to the sense circuitry, wherein the capacitor masks the sense circuitry from the DC voltage being applied.

5. The MEMS as described in claim 1 further comprising:
   a force feedback circuitry configured to apply a charge associated with a sensed signal to the sense electrodes during a forcing time period to move the proof mass from a first position to a second position and wherein the sense circuitry is inactive during the forcing time period, wherein the force feedback circuitry and the sense circuitry are time multiplexed, and wherein the sense electrodes are used for sensing, for force feedback and for matching the resonance frequency between the sense mode and the drive mode.

6. A micro electro mechanical system (MEMS) comprising:
   a proof mass configured to move responsive to stimuli;
   sense electrodes configured to generate a signal responsive to the proof mass moving; and
   a frequency modifying circuitry configured to apply a direct current (DC) voltage to the sense electrodes, wherein the DC voltage is configured to change a stiffness of a spring of the proof mass, and wherein the change in the stiffness of the spring matches a resonance frequency in a sense mode to a resonance frequency in a drive mode, wherein the frequency modifying circuitry comprises:
      a diode;
      a capacitor coupled to the diode; and
      an NMOS switch,
      wherein the diode is configured to charge the capacitor when the NMOS switch is open, and wherein the NMOS switch is configured to electrically connect the capacitor to the sense electrodes when the NMOS switch is closed, wherein the DC voltage is a voltage from the capacitor being applied to the sense electrodes when the NMOS switch closes, and wherein the diode is electrically disconnected from the capacitor when the NMOS switch is closed, and wherein the NMOS switch is protected against high voltage stress by opening the NMOS switch when the capacitor is being charged by the diode and by closing the NMOS switch when the capacitor is not being charged by the diode.

7. The MEMS as described in claim 6, wherein the sense electrodes are a comb structure.

8. The MEMS as described in claim 6, wherein a circuitry for generating a signal for closing and opening the NMOS switch comprises:
   another diode;
   a level shifter configured to receive a signal having a first voltage value or a second voltage value and wherein the level shifter is configured to generate a shifted signal having the first voltage value or a third voltage value; and
   another capacitor coupled between the diode and the level shifter, wherein a voltage associated with the another capacitor is the DC voltage being applied to the sense electrodes, and wherein the another capacitor is charged using the another diode and output of the level shifter, and wherein the DC voltage is a sum of the first voltage value and a voltage being applied by the diode or a sum of the third voltage value and the voltage being applied by the another diode.

9. The MEMS as described in claim 6 further comprising:
   a force feedback circuitry configured to apply a charge associated with a sensed signal to the sense electrodes during a forcing time period to move the proof mass from a first position to a second position, and wherein the sense electrodes are used for sensing, for force feedback and for matching the resonance frequency between the sense mode and the drive mode.

10. A micro electro mechanical system (MEMS) comprising:
    a proof mass configured to move responsive to stimuli;
    sense electrodes configured to generate a signal responsive to the proof mass moving;
    sense circuitry coupled to the sense electrodes, wherein the sense circuitry is configured to receive the generated signal and further configured to process the generated signal; and
    a frequency matching circuitry configured to apply a direct current (DC) voltage to the sense electrodes, wherein the DC voltage is configured to change a stiffness of a spring of the proof mass and wherein the change in the stiffness of the spring matches a resonance frequency between a sense mode and a drive mode, wherein the frequency matching circuitry comprises:
       a PMOS switch;
       a capacitor coupled to the PMOS switch; and
       a NMOS switch,
       wherein the capacitor is configured to charge when the PMOS switch closes and when the NMOS switch opens, and wherein the capacitor is electrically connected to the sense electrodes when the NMOS switch closes and when the PMOS switch opens and wherein the DC voltage is applied to the sense electrodes when the capacitor is electrically connected to the sense electrodes, and wherein the NMOS switch is protected against high voltage stress by opening the NMOS switch when the capacitor is being charged and by closing the NMOS switch when the capacitor is not being charged.

11. The MEMS as described in claim 10, wherein the sense electrodes are a comb structure.

12. The MEMS as described in claim 10, wherein the frequency matching circuitry is coupled to a capacitor that is coupled to the sense circuitry, wherein the capacitor masks the sense circuitry from the DC voltage being applied.

13. The MEMS as described in claim 10, further comprising:

a force feedback circuitry configured to apply a charge associated with a sensed signal to the sense electrodes during a forcing time period to move the proof mass from a first position to a second position and wherein the sense circuitry is inactive during the forcing time period, wherein the force feedback circuitry and the sense circuitry are time multiplexed, and wherein the sense electrodes are used for sensing, for force feedback and for matching the resonance frequency between the sense mode and the drive mode.

14. A micro electro mechanical system (MEMS) comprising:
a proof mass configured to move responsive to stimuli;
sense electrodes configured to generate a signal responsive to the proof mass moving; and
a frequency modifying circuitry configured to apply a direct current (DC) voltage to the sense electrodes, wherein the DC voltage is configured to change a stiffness of a spring of the proof mass, and wherein the change in the stiffness of the spring matches a resonance frequency in a sense mode to a resonance frequency in a drive mode, wherein the frequency modifying circuitry comprises:
a PMOS switch;
a capacitor coupled to the PMOS switch; and
a NMOS switch,
wherein the capacitor is configured to charge when the PMOS switch closes and when the NMOS switch opens, and wherein the capacitor is electrically connected to the sense electrodes when the NMOS switch closes and when the PMOS switch opens and wherein the DC voltage is applied to the sense electrodes when the capacitor is electrically connected to the sense electrodes, and wherein the NMOS switch is protected against high voltage stress by opening the NMOS switch when the capacitor is being charged and by closing the NMOS switch when the capacitor is not being charged.

15. The MEMS as described in claim 13, wherein the sense electrodes are a comb structure.

16. The MEMS as described in claim 13 further comprising:
a force feedback circuitry configured to apply a charge associated with a sensed signal to the sense electrodes during a forcing time period to move the proof mass from a first position to a second position, and wherein the sense electrodes are used for sensing, for force feedback and for matching the resonance frequency between the sense mode and the drive mode.

* * * * *